(12) United States Patent
Raynor et al.

(10) Patent No.: US 9,059,064 B2
(45) Date of Patent: Jun. 16, 2015

(54) SENSOR MODULE WITH DUAL OPTICAL SENSORS FOR A CAMERA

(75) Inventors: Jeffrey Raynor, Edinburgh (GB); Arnaud Laflaquiere, Edinburgh (GB); Stewart Smith, Edinburgh (GB)

(73) Assignee: STMICROELECTRONICS (RESEARCH & DEVELOPMENT) LIMITED, Marlow Bucks (GB)

( * ) Notice: Subject to any disclaimer, the term of this patent is extended or adjusted under 35 U.S.C. 154(b) by 312 days.

(21) Appl. No.: 12/843,497

(22) Filed: Jul. 26, 2010

(65) Prior Publication Data

US 2011/0019048 A1 Jan. 27, 2011

(30) Foreign Application Priority Data

Jul. 27, 2009 (GB) .................................. 0912970.1

(51) Int. Cl.
| | |
|---|---|
| *H04N 5/335* | (2011.01) |
| *H01L 27/146* | (2006.01) |
| *H04N 5/225* | (2006.01) |
| *H04N 5/33* | (2006.01) |
| *H04N 9/04* | (2006.01) |
| *H01L 27/144* | (2006.01) |
| *H01L 31/0232* | (2014.01) |

(52) U.S. Cl.
CPC .......... *H01L 27/14645* (2013.01); *H04N 5/335* (2013.01); *H01L 27/1446* (2013.01); *H01L 27/14603* (2013.01); *H01L 27/14625* (2013.01); *H01L 27/14632* (2013.01); *H01L 27/14643* (2013.01); *H01L 27/14685* (2013.01); *H01L 27/14687* (2013.01); *H01L 27/14689* (2013.01); *H01L 31/0232* (2013.01); *H04N 5/2253* (2013.01); *H04N 5/332* (2013.01); *H04N 9/045* (2013.01)

(58) Field of Classification Search
CPC ...... H04N 5/2253; H04N 5/335; H04N 5/232
USPC ......................................................... 348/302
See application file for complete search history.

(56) References Cited

U.S. PATENT DOCUMENTS

| | | | |
|---|---|---|---|
| 3,971,065 A | 7/1976 | Bayer | 358/41 |
| 4,956,686 A | 9/1990 | Borello et al. | 357/30 |
| 5,120,960 A | 6/1992 | Halvis | 250/338.4 |
| 5,444,280 A | 8/1995 | Blouke et al. | 257/226 |
| 6,184,538 B1 | 2/2001 | Bandara et al. | 257/21 |
| 6,437,335 B1 * | 8/2002 | Bohn | 250/360.1 |
| 6,548,833 B1 * | 4/2003 | Lin et al. | 257/89 |
| 7,199,348 B2 | 4/2007 | Olsen et al. | 250/208.1 |
| 7,619,683 B2 * | 11/2009 | Davis | 348/374 |
| 2002/0113888 A1 * | 8/2002 | Sonoda et al. | 348/315 |
| 2003/0093805 A1 * | 5/2003 | Gin | 725/105 |
| 2003/0117501 A1 * | 6/2003 | Shirakawa | 348/218.1 |

(Continued)

FOREIGN PATENT DOCUMENTS

| | | | |
|---|---|---|---|
| JP | 10065871 | 3/1998 | H01L 27/14 |
| JP | 2002330359 | 11/2002 | H01L 27/14 |

(Continued)

*Primary Examiner* — Nicholas Giles
*Assistant Examiner* — Abdelaaziz Tissire
(74) *Attorney, Agent, or Firm* — Allen, Dyer, Doppelt, Milbrath & Gilchrist, P.A.

(57) ABSTRACT

A sensor module has first and second sensor arrays formed on a substrate, with the first and second sensor arrays adapted to share common readout circuitry and shared read out for a pair of sensors on a single array.

19 Claims, 4 Drawing Sheets

(56) References Cited

U.S. PATENT DOCUMENTS

| | | | |
|---|---|---|---|
| 2004/0090550 A1* | 5/2004 | Park | 348/350 |
| 2005/0046740 A1* | 3/2005 | Davis | 348/373 |
| 2005/0128509 A1* | 6/2005 | Tokkonen et al. | 358/1.15 |
| 2005/0134698 A1* | 6/2005 | Schroeder et al. | 348/218.1 |
| 2005/0146790 A1* | 7/2005 | Liu et al. | 359/586 |
| 2005/0255627 A1* | 11/2005 | Omori | 438/64 |
| 2006/0054782 A1* | 3/2006 | Olsen et al. | 250/208.1 |
| 2006/0125947 A1 | 6/2006 | Packer et al. | 348/340 |
| 2006/0187312 A1* | 8/2006 | Labaziewicz et al. | 348/218.1 |
| 2007/0295893 A1* | 12/2007 | Olsen et al. | 250/226 |
| 2008/0087800 A1* | 4/2008 | Toda | 250/214 C |
| 2008/0095523 A1* | 4/2008 | Schilling-Benz et al. | 396/111 |
| 2008/0278610 A1* | 11/2008 | Boettiger | 348/273 |
| 2009/0121307 A1 | 5/2009 | Tennant | 257/440 |
| 2009/0207272 A1* | 8/2009 | Culbert et al. | 348/223.1 |
| 2011/0228142 A1* | 9/2011 | Brueckner et al. | 348/241 |

FOREIGN PATENT DOCUMENTS

| | | | |
|---|---|---|---|
| WO | 97/20434 | 6/1997 | H04N 9/04 |
| WO | 2005/067417 | 7/2005 | H01L 31/00 |
| WO | 2006/108210 | 10/2006 | G08B 17/12 |

* cited by examiner

SENSOR MODULE WITH DUAL OPTICAL SENSORS FOR A CAMERA

FIELD OF THE INVENTION

The present invention relates to a sensor and sensor system for a camera, particularly but not exclusively, a camera system capable of producing good quality images at relatively low light levels.

BACKGROUND OF THE INVENTION

The design and the miniaturization of cameras continue to present many issues. For example, the ability of a system to provide good images at low light levels has been sought for many years.

U.S. Pat. No. 3,971,065 discloses a color imaging array having a single sensor. The patent discloses a RGGB filter over the pixel. This provides high luminance resolution and also good sensitivity. However, using this technique, more light reaches the white pixel (as compared with the RGB pixels), which means that the RGB pixels are underexposed and thus suffer from noise issues.

U.S. Pat. No. 7,199,348 discloses an apparatus for multiple camera devices and method of operating the same, which discloses using separate sensors at different wavelengths and different integration times. There is no teaching of how the sensors can be aligned or how multiple sensors can be used to assist in low light conditions.

A technique known as white light illumination has a standard color image sensor and white light illumination such as a flash or LED. A flash is power efficient but not suitable for video applications, and white light is not very efficient for portable applications were energy storage is critical. In addition, bright light can prove a distraction to the subject thereby making filming unpleasant.

A thicker epitaxial Silicon layer is known to alter the absorption depth of light in Silicon in a wavelength dependant manner, with longer wavelengths penetrating deeper into the Silicon. This can be used to adapt a device for different wavelengths but has certain disadvantages associated therewith.

While the prior art addresses some issues, a camera module which can adequately deal with low light levels is still needed.

SUMMARY OF THE INVENTION

The present invention provides a method and system as set out in the accompanying claims. According to one aspect, there is a sensor module having first and second sensor arrays formed on a substrate, with the first and second and second sensor arrays being adapted to share common read out circuitry and shared read out for a pair of sensors on a single array.

This enables the production of the dual or multiple sensor on a single substrate. In addition, a dual lens assembly can be formed on the single substrate for use in a camera module. The combination of the dual multiple sensor and dual lens effectively forms a dual or multiple camera assembly. Throughout the specification reference is made to dual, although it will be appreciated multiple assemblies may be used instead. The dual sensor can have one sensor responsive to IR radiation, therefore enabling a camera which is capable of responding well in low light conditions as some of the radiation depended upon is in a different domain from the visual. The output from the dual assemblies is combined to form an overall image based on sensors responsive to more than one different optical condition.

BRIEF DESCRIPTION OF THE DRAWINGS

Reference will now be made, by way of example, to the accompanying drawings, in which.

DETAILED DESCRIPTION OF THE PREFERRED EMBODIMENTS

The present invention relates to a sensor wafer and a lens wafer formed in conjunction to provide a camera system providing good images at low light levels. This is in contrast with the manner in which lenses were produced in the past; by moulding individual lens elements, assembling them in a barrel and then mounting each barrel on a sensor. Typically sensors are produced at a wafer level where thousands of individual dies are fabricated on a wafer and then cut into pieces. The present invention takes advantage of manufacturing sensors and wafers in a similar way and in conjunction.

As mentioned above, lens manufacture is being transferred to wafer level production with a number of lenses moulded at the same time on a single substrate. It is also possible with this multilayer process to form a barrel in the substrate, if desired. It should be noted that the terms "optical", "luminescence" and "light" are intended to cover other wavelength ranges in the spectrum and are not limited to the visual spectrum.

Figure 1:
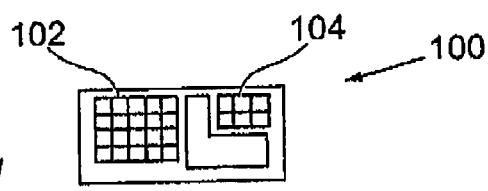
FIG. 1 is a diagram of a sensor with two image arrays, in accordance with an embodiment of the invention.

FIG. 1 shows a sensor 100 with two image arrays 102 and 104. Image array 102 is a high resolution sensor array including a color filter, such as a Bayer pattern for example. The high resolution sensor has between 2 and 8 Mpixels. Image array 104 is of low resolution such as a video graphics array (VGA) and may not include color filtering. By including two image arrays it is possible for each to be responsive to light or radiation in different manners. For example, one array may be IR sensitive and the other visual lightsensitive. Then, if the visual light level is low, the IR array may make a greater contribution to the overall image. The outputs from both image arrays may be combined to compensate for low light levels. Different arrays may be sensitive to different forms of radiation. Different numbers of arrays may be employed in certain circumstances.

Figure 2:
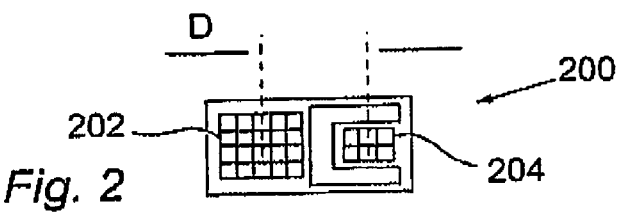
FIG. 2 is a diagram of a sensor with two image arrays sharing a common axis, in accordance with an embodiment of the invention.
Figure 3:
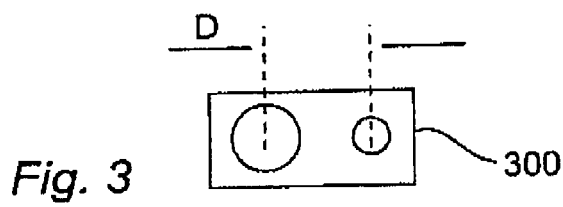
FIG. 3 is a diagram of a plan view of an optical assembly module, in accordance with an embodiment of the invention.

FIG. 2 shows a second embodiment of a sensor 200 including two image arrays 202 and 204. In this example the image arrays have a common axis and are separated by a known distance D. This distance D is also shown in FIG. 3 as the distance between the two optical centers of the lens assembly 300. The two lenses 302 and 304 are also shown in FIG. 3. The relative position of the image arrays and their lenses on their respective wafers will be predetermined in order to ensure the functionality of the subsequent process and to simplify subsequent alignment.

Figure 4:
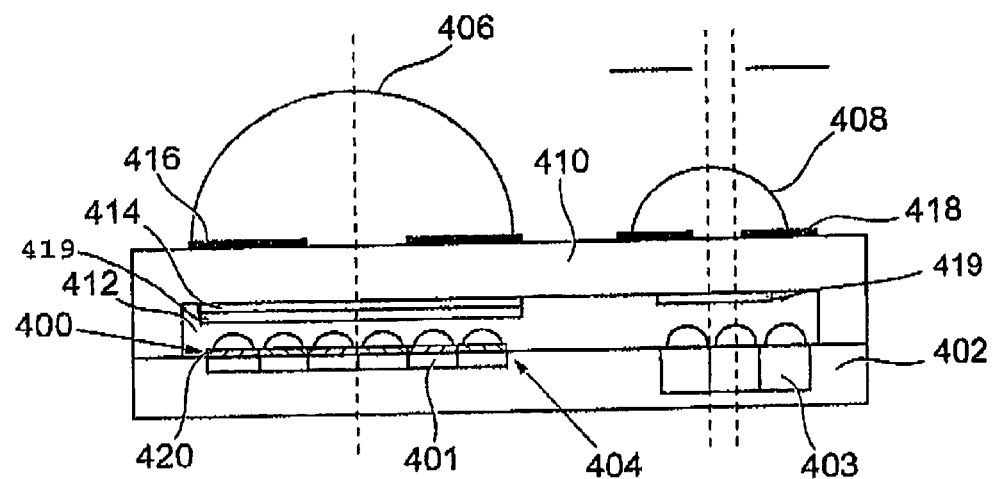
FIG. 4 is a diagram of a cross-section of the optical assembly module, in accordance with an embodiment of the invention.

Referring now to FIG. 4, a cross-sectional view of the optical assembly 300 is shown in more detail. This optical assembly includes a high resolution color sensor 400 and a low resolution sensor with no color 402 on a first substrate 404. Each sensor is made up of pixels 401 and 403 respectively. The lower resolution sensor has a deeper junction to enable this sensor to respond to different wavelengths. The deeper junction is suitable for detection of longer wavelengths, e.g. Red and IR. These photons have less energy and can penetrate more deeply into the silicon before generating electron-hole pairs. The high resolution sensor 400 includes a filter 420 such as a Bayer filter. A Bayer filter has pixels as follows from a top view:

R G R G R G etc.
G B G B G B etc.
R G R G R G etc.
G B G B G B etc.

where R stands for red, G for green and B for blue. In FIG. 4 the cross-section has cut through an R G R G R G line of the Bayer matrix. Sensors 400 and 402 each include respective micro lenses. These micro lenses focus light onto the photosensitive part of each underlying pixel.

Two separate lenses or lens assemblies 406 and 408 are supported on a second substrate 410. The assembly may further include a cavity 412, which may be gas filled with air or nitrogen, for example. In one embodiment, an infrared stop filter 414 is included in the optical high resolution color sensor. Filter 414 is shown on the underside of the lens assembly but may equally well be placed at any other location in the optical path. For example, on the top side of the lens assembly; on the surface of the or each micro lens (not shown); or on the primary lens 406. In an alternative embodiment, one or more of the lenses or lens elements may be fabricated from a material that blocks infrared light. If sensors of sensitivities other than IR are being used, the IR stop filter or equivalent may be changed appropriately.

The lenses 406 and 408 may each include a single optical surface or a compound lens. FIG. 4 shows a single optical surface for ease of drawing. Each lens or lens assembly also includes an aperture stop 416 and 418 respectively. Again, these can be in any appropriate location through the optical path of each lens and sensor assembly and in this instance are shown on the upper surface of substrate 404. In addition, a "phase plate" 419 may be incorporated into the structure. A "phase plate" 419 is a computer generated holographic structure which is used to enhance the depth of field of the system. The optical axes of both lenses may be aligned with the optical center of the image. However, this may only provide alignment for a far away object. Accordingly, the optical axis of the high resolution lens may be aligned with the center of the image and the optical axis of the low resolution lens is shifted, such that an object at 1 m to 2 m from the camera will produce correct alignment of the two images. Clearly, depending on the particular use of the camera and the lens assembly, many variations of the optical axes may be foreseen along with variations of position and relative position of all of the constituent parts.

The resultant sensor and lens assembly each contribute a camera assembly. Each camera assembly is adapted for use in different conditions, for example different wavelengths, different resolutions, different luminescence, etc.

Figure 5:
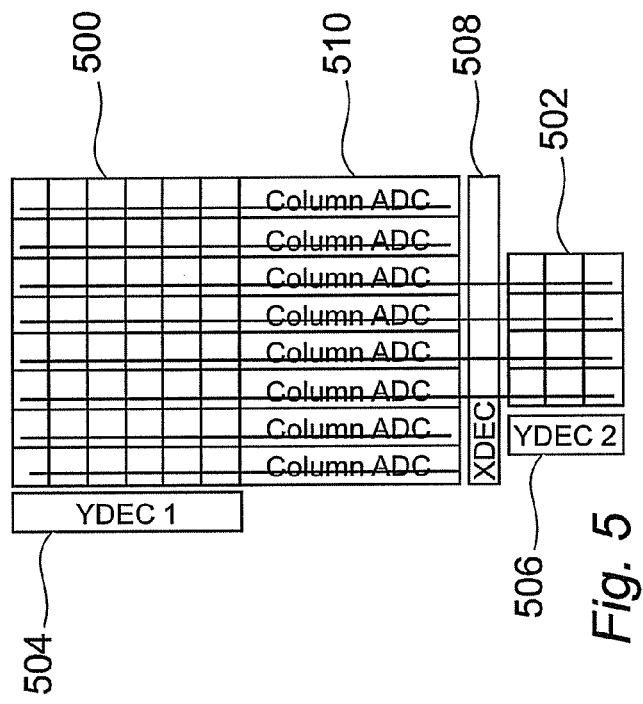
FIG. 5 is a diagram of two image arrays sharing common readout electronics, in accordance with an embodiment of the invention.

Referring to FIG. 5, a readout circuit will now be described. It is possible to have two separate and independent imaging systems on a single die, each with its own readout structure. However, FIG. 5 shows two separate and independent imaging systems 500 and 502 on a single die that are arranged so that a single readout structure can be shared between the two arrays. A readout structure includes sample and hold circuits; amplifiers; analog to digital converters; etc. In the diagram, the y-direction readout circuits 504 and 506 are shown as separate readout circuits for each imaging system. However a different alignment of the imaging systems 500 and 502 could be implemented to provide for a shared y-direction readout circuit. In the x-direction, each column is shown with an analog to digital converter 510, each feeding into an x-direction readout circuit 508. In order to optimize the layout and the sharing of common readout circuits, it is desirable for the two sensors to have the same pixel pitch or in integral multiple thereof. For example, array 500 may have a pixel pitch of 1.75 p, while array 502 may have a pixel pitch of 1.75 p or 3.5 p. Clearly other pitches may be used as long as the desired relationship is met.

When designing the layout for the arrays 500 and 502 a consideration is made in relation to the efficiency of use of the die area and the coaxial alignment of the two arrays. Where cost is a dominant factor, efficient use of the die area may well take precedence over the coaxial alignment of the arrays. The coaxial alignment of the arrays may have advantages with respect to registration of the optical path and processing of the image. The array 500 and 502 may be adapted to different wavelength sensitivities. For example, array 502 may include photodiodes which are optimized for IR sensitivity. This may be achieved by having a deeper epitaxial layer than the primary array and/or by having a deeper junction to collect the photogenerated charge carriers. Other combinations of wavelength sensitivity may be used for different arrays depending on the requirements of the system in question.

Figure 6:
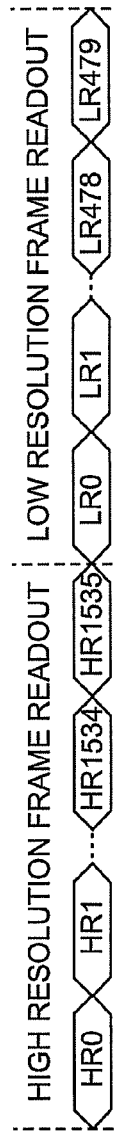
FIG. 6 is a diagram of a frame interleaved readout, in accordance with an embodiment of the invention.
Figure 7:
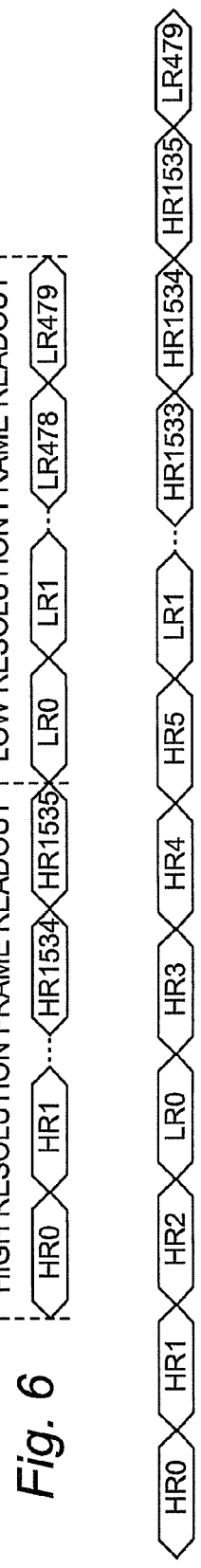
FIG. 7 is a diagram of a row interleaved readout, in accordance with an embodiment of the invention.

The output from the readout circuits can then be read out in a number of different ways. It is possible to frame interleave the readout by means or circuitry for reading out one image array in its entirety and then subsequently reading out the second image array in its entirety. This is shown in FIG. 6. A more desirable method includes row interleave, where the readout of one line from one array is processed followed by the readout from a line of the second array. This is shown in FIG. 7. Row interleave means that the images are more readily time synchronized and thus temporal artifacts tend to be minimized.

In operation, during low light levels, an IR LED source may be utilized to illuminate the scene during filming or photography. The output from the high resolution sensor may be output at a high resolution. However, it is preferred to reduce the resolution of the high resolution sensor to substantially match that of the low resolution sensor. This can be achieved by techniques such as analog binning or by processing in the digital domain. Noise filtering algorithms such as a median filter or sigma filter may also be applied to the data from the high resolution sensor. This is helpful as the high resolution sensor tends to be noisier due to the presence of the color filter. The color filters absorb most light of a specific color. For example, a blue filter absorbs most of the blue photons. As a result, the pixel receives less light overall which means the signal to noise ratio is degraded. The human visual system is generally less sensitive to color noise and the noise in an image having a high spatial frequency, such as edge noise, than other noise. The various techniques mentioned above give rise to a combination of a readout from the low resolution monochrome sensor (which has good SNR and provides the lower spatial content) with a readout from the higher resolution sensor which results in an image system capable of operating in low light condition and which produces a pleasing image to the observer.

Figure 8:
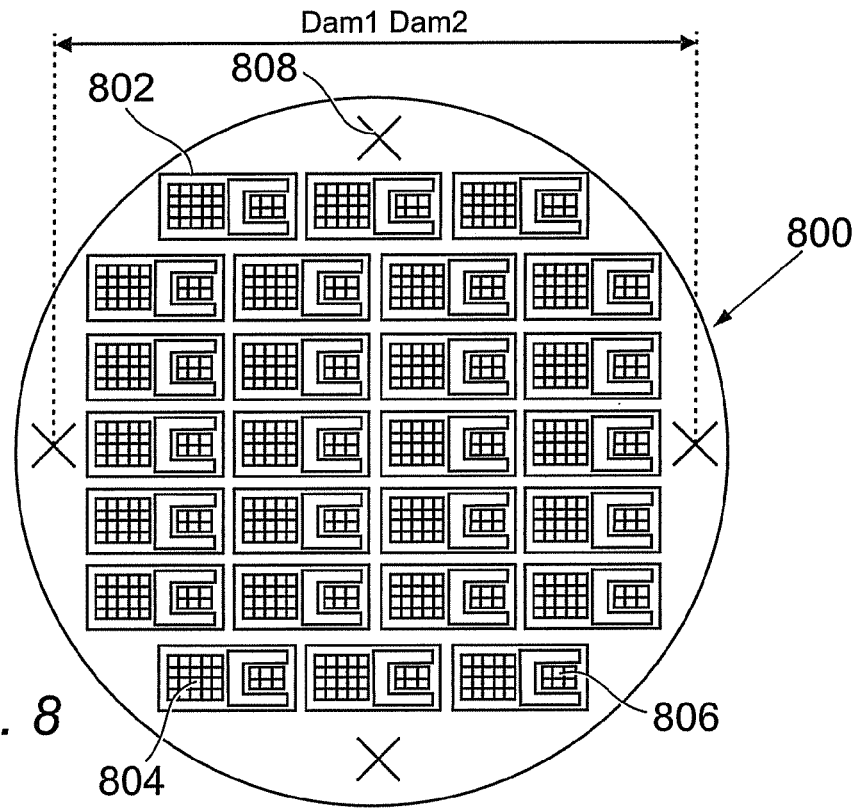
FIG. 8 is a diagram of a plan view of a sensor wafer, in accordance with an embodiment of the invention.

Referring now to FIG. 8, the wafer level assembly is shown. The sensor wafer 800 includes a number of dual sensors 802 each including a sensor 804 and a sensor 806 similar to those shown in FIG. 4. The wafer also includes at least three, but preferably more alignment marks 808. These alignment marks are ideally positioned as far apart from one another as possible.

Figure 9:
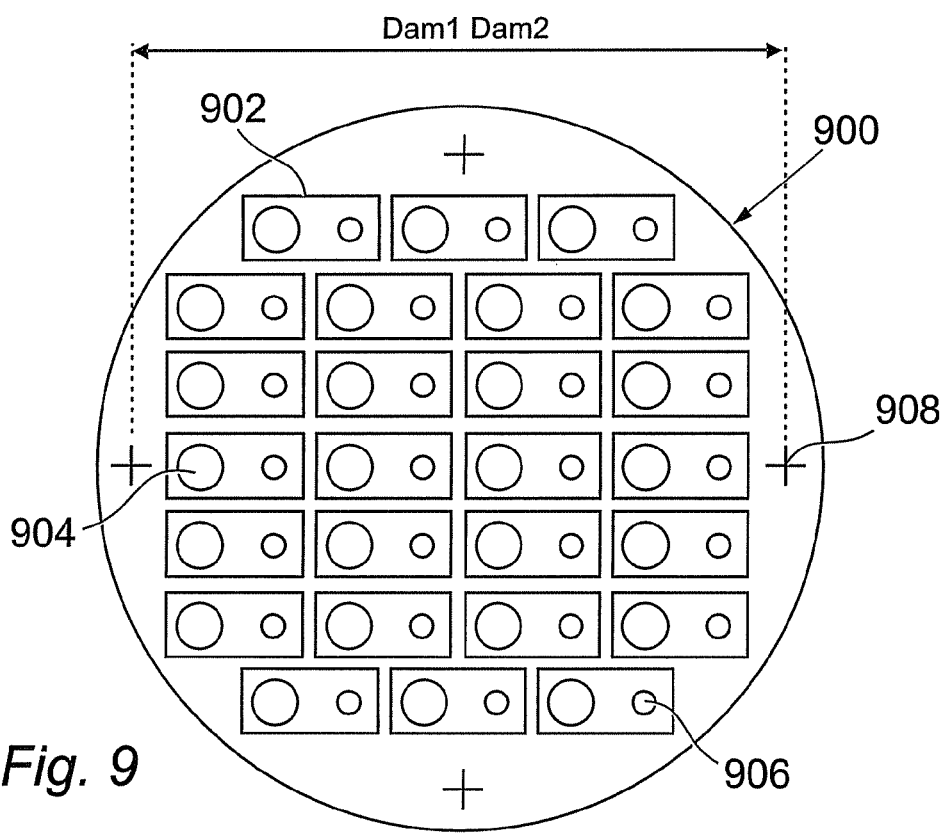
FIG. 9 is a diagram of a plan view of a lens wafer, in accordance with an embodiment of the invention.

FIG. 9 shows the plan view of the lens wafer assembly 900. The lens wafer 900 includes a number of dual lens assemblies 902, each including two lenses 904 and 906 similar to those in FIG. 4. Alignment marks 908 are also shown. As previously stated, the optical centers of the lenses are the same distance as the optical centers of the sensors. In addition, the pitch and placement of each lens assembly 902 corresponds to an equivalent dual sensor 802. In addition, the alignment marks on the lens assembly should be equivalent to those on the sensor wafer. These various alignments are accomplished using modern photographic methods and tools and enable correct alignment of the two wafers.

Once both the lens wafer 900 and sensor wafer 800 have been manufactured, these two wafers may then be aligned for the next stage of production. This is achieved by using an active alignment system, such as a video camera equipped with a microscopic objective lens which monitors the alignment between the sensor wafer and the lens wafer and adjusts their relative position until an optimal alignment is achieved. Once the system is optimally aligned, the lens wafer and the sensor may be bonded together. This can be achieved in various different ways. For example, one surface may be coated with an epoxy resin before assembly and once aligned the epoxy resin is secured using, for example, ultraviolet (UV) light. It is not always necessary to cure the whole assembly at this stage as local curing of the epoxy will hold the alignment in place while the final assembly is cured, for example in an oven.

Figure 10:
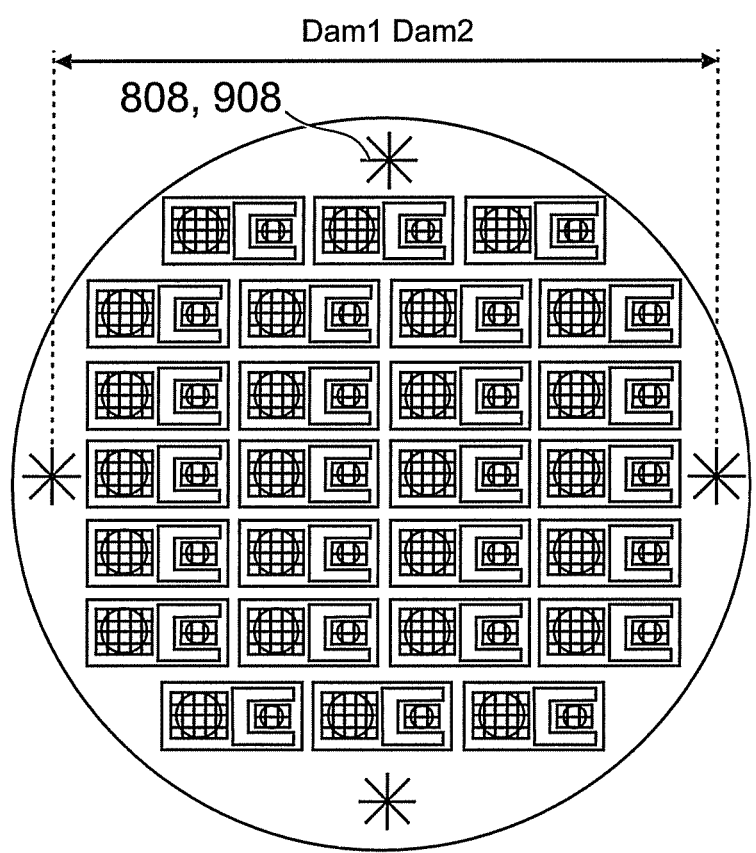
FIG. 10 is a diagram of a plan view of an aligned sensor wafer and lens wafer assembly, in accordance with an embodiment of the invention.

FIG. 10 shows the final assembly with the lens wafer and the sensor wafer superimposed one over the other thereby forming camera assemblies 1000 and 1002. Once the final assembly has been made, the individual assemblies can be separated from one another by normal techniques such as sawing or cutting and then incorporated into a camera module.

The readout circuits may be part of the lens wafer or the sensor wafer or may be applied after the assemblies are completed. The combination of sensors, lenses and readout circuitry manufactured in this way produces a camera adapted for low light levels which is formed on a single substrate.

The sensor or camera module is suitable for use in any appropriate device including, for example, a computer or communications device, a mobile telephone or a camera.

That which is claimed:

1. A sensor module comprising:
   a first integrated circuit die substrate;
   a second substrate on the first integrated circuit die substrate and forming a cavity therebetween;
   first and second sensor arrays formed on the first integrated circuit die substrate and enclosed by the cavity, each sensor array having a plurality of pixels and an optical axis, with the cavity being shared by said first and second sensor arrays, and with said first sensor array configured for use in an infrared (IR) light condition and with said second sensor array configured for use in a visual light condition, wherein the first sensor array has a deeper junction depth in the first integrated circuit die substrate than a junction depth of the second sensor array to detect IR wavelengths and each sensor array including a plurality of microlenses, wherein a microlens is arranged to a specific pixel to focus light onto the respective pixel;
   first and second optical lenses, each having an optical axis and cooperating with respective first and second sensor arrays to form first and second camera assemblies, wherein the optical axis of the first optical lens is offset from the optical axis of the first sensor array and the first optical lens is smaller in diameter than the second optical lens; and
   common readout circuitry coupled to said first and second sensor arrays for combining outputs from said first and second sensor arrays to compensate for different light conditions.

2. The sensor module of claim 1, wherein said first and second sensor arrays have parallel optical axes.

3. The sensor module of claim 1, wherein the optical axis of said second sensor array is aligned with the optical axis of said second optical lens.

4. The sensor module of claim 1, wherein said first camera assembly has a different resolution than said second camera assembly.

5. The sensor module of claim 1, wherein said second sensor array includes a color filter.

6. The sensor module of claim 1, wherein said first and second sensor arrays have first and second pixel pitches, respectively, the first pixel pitch being equal to the second pixel pitch.

7. The sensor module of claim 1, wherein said first and second sensor arrays have first and second pixel pitches, respectively, the first pixel pitch being a multiple of the second pixel pitch.

8. The sensor module of claim 1, wherein the common readout circuitry is formed on the first integrated circuit die substrate.

9. A sensor module comprising:
   a first integrated circuit die substrate;
   a second substrate on the first integrated circuit die substrate and forming a cavity therebetween;
   first and second sensor arrays formed on the first integrated circuit die substrate and enclosed by the cavity and having parallel optical axes and each having a plurality of pixels, with the cavity being shared by said first and second sensor arrays, and said first sensor array being configured for use in infrared (IR) light conditions and said second sensor array being configured for use in visual light conditions, wherein the first sensor array has a deeper junction depth in the first integrated circuit die substrate than a junction depth of the second sensor array to detect IR wavelengths and each sensor array including a plurality of microlenses, wherein a microlens is arranged to a specific pixel to focus light onto the respective pixel;
   first and second optical lenses, each having an optical axis and cooperating with first and second sensor arrays to form first and second camera assemblies, wherein the optical axis of the first optical lens is offset from the optical axis of the first sensor array and the first optical lens is smaller in diameter than the second optical lens; and common readout circuitry coupled to said first and second sensor arrays for combining outputs from said first and second sensor arrays to compensate for the different light conditions.

10. The sensor module of claim 9, wherein the optical axis of said second sensor array is aligned with the optical axis of said second optical lens.

11. The sensor module of claim 9, wherein said first camera assembly has a different resolution than said second camera assembly.

12. The sensor module of claim 9, wherein said second sensor array includes a color filter.

13. The sensor module of claim 9, wherein the common readout circuitry is formed on the first integrated circuit die substrate.

14. A method of making a sensor module comprising:
forming first and second sensor arrays on a first integrated circuit die substrate, each sensor array having a plurality of pixels and an optical axis, with the first sensor array configured for use in an infrared (IR) light condition and with the second sensor array configured for use in a visual light condition, wherein the first sensor array has a deeper junction depth in the first integrated circuit die substrate than a junction depth of the second sensor array to detect IR wavelengths and each sensor array including a plurality of microlenses, wherein a microlens is arranged to a specific pixel to focus light onto the respective pixel;
coupling a second substrate on the first integrated circuit die substrate to form a cavity therebetween so as to enclose the first and second sensor arrays, with the cavity being shared by the first and second sensor arrays;
forming first and second optical lenses, each having an optical axis and cooperating with first and second sensor arrays to form first and second camera assemblies, wherein the optical axis of the first optical lens is offset from the optical axis of the first sensor array and the first optical lens is smaller in diameter than the second optical lens; and
coupling common readout circuitry to the first and second sensor arrays for combining outputs from the first and second sensor arrays to compensate for different light conditions.

15. The method of claim 14, wherein the first and second sensor arrays have parallel optical axes.

16. The method of claim 14, wherein the optical axis of said second sensor array is aligned with the optical axis of said second optical lens.

17. A method of manufacturing a camera module comprising:
forming a plurality of dual optical sensors on a first wafer, with the dual optical sensors each comprising a first sensor array configured for use in an infrared (IR) light condition and a second sensor array configured for use in a visual light condition, each sensor array having a plurality of pixels and an optical axis, wherein the first sensor array is formed to have a deeper junction depth in the first wafer than the junction depth of the second sensor array to detect IR wavelengths and each sensor array including a plurality of microlenses, wherein a microlens is arranged to a specific pixel to focus light onto the respective pixel; and
forming a plurality of dual optical assemblies on a second wafer, each dual optical assembly comprising first and second optical lenses, each having an optical axis and the first optical lens is smaller in diameter than the second optical lens;
aligning the first and second wafers such that an optical axis at each first optical lens is offset from the optical axis of the first sensor array, respectively;
bonding the first and second wafers to thereby form a plurality of camera assemblies so that the dual optical sensors are enclosed by a cavity, with the cavity being shared by the first and second sensor arrays; and
separating the plurality of dual camera assemblies.

18. A camera module comprising:
a sensor module comprising
a first integrated circuit die substrate,
first and second sensor arrays on the first integrated circuit die substrate, each sensor array having a plurality of pixels and an optical axis, with said first sensor array configured for use in an infrared (IR) light condition and with said second sensor array configured for use in a visual light condition, wherein the first sensor array has a deeper junction depth in the first integrated circuit die substrate than a junction depth of the second sensor array to detect IR wavelengths and each sensor array including a plurality of microlenses, wherein a microlens is arranged to a specific pixel to focus light onto the respective pixel,
a second substrate on the first integrated circuit die substrate and forming a cavity therebetween so as to enclose the first and second sensor arrays, with the cavity being shared by said first and second sensor arrays,
common readout circuitry coupled to said first and second sensor arrays for combining outputs from said first and second sensor arrays to compensate for different light conditions; and
first and second optical lenses, each having an optical axis, and cooperating with first and second sensor arrays to form first and second camera assemblies, wherein the optical axis of the first optical lens is offset from the optical axis of the first sensor array and the first optical lens is smaller in diameter than the second optical lens.

19. A device comprising:
a camera module comprising a sensor module comprising
a first integrated circuit die substrate,
first and second sensor arrays formed on the first integrated circuit die substrate, each sensor array having a plurality of pixels and an optical axis, with said first sensor array being configured for use in an infrared (IR) light condition and with said second sensor array being configured for use in a visual light condition, wherein the first sensor array has a deeper junction depth in the first integrated circuit die substrate than a junction depth of the second sensor array to detect IR wavelengths and each sensor array including a plurality of microlenses, wherein a microlens is arranged to a specific pixel to focus light onto the respective pixel,
a second substrate on the first integrated circuit die substrate and forming a cavity therebetween so as to enclose the first and second sensor arrays, with the cavity being shared by said first and second sensor arrays,
common readout circuitry coupled to said first and second sensor arrays for combining outputs from said first and second sensor arrays to compensate for different light conditions; and
first and second optical lenses, each having an optical axis, and cooperating with first and second sensor arrays to form first and second camera assemblies, wherein the optical axis of the first optical lens is offset from the optical axis of the first sensor array and the first optical lens is smaller in diameter than the second optical lens.

* * * * *